United States Patent
Cao et al.

(10) Patent No.: US 12,020,614 B2
(45) Date of Patent: Jun. 25, 2024

(54) GATE DRIVE CIRCUIT AND DISPLAY PANEL

(71) Applicant: Wuhan China Star Optoelectronics Technology Co., Ltd., Hubei (CN)

(72) Inventors: Haiming Cao, Hubei (CN); Chao Tian, Hubei (CN); Yanqing Guan, Hubei (CN); Fei Ai, Hubei (CN); Guanghui Liu, Hubei (CN)

(73) Assignee: Wuhan China Star Optoelectronics Technology Co., Ltd., Wuhan (CN)

( * ) Notice: Subject to any disclaimer, the term of this patent is extended or adjusted under 35 U.S.C. 154(b) by 0 days.

(21) Appl. No.: 17/441,303

(22) PCT Filed: Aug. 6, 2021

(86) PCT No.: PCT/CN2021/111237
§ 371 (c)(1),
(2) Date: Feb. 9, 2023

(87) PCT Pub. No.: WO2023/010542
PCT Pub. Date: Feb. 9, 2023

(65) Prior Publication Data
US 2024/0029609 A1 Jan. 25, 2024

(30) Foreign Application Priority Data
Aug. 3, 2021 (CN) .......................... 202110884027.1

(51) Int. Cl.
G09G 3/3266 (2016.01)
G09G 3/20 (2006.01)

(52) U.S. Cl.
CPC ....... *G09G 3/20* (2013.01); *G09G 2310/0267* (2013.01); *G09G 2310/08* (2013.01); *G09G 2320/045* (2013.01)

(58) Field of Classification Search
CPC ............ G09G 3/20; G09G 2310/0267; G09G 2310/08; G09G 2320/045; G11C 19/287
See application file for complete search history.

(56) References Cited

U.S. PATENT DOCUMENTS

2005/0220263 A1 10/2005 Moon
2010/0034338 A1 2/2010 Osame et al.
(Continued)

FOREIGN PATENT DOCUMENTS

CN 1748366 3/2006
CN 104464663 3/2015
(Continued)

OTHER PUBLICATIONS

International Search Report and the Written Opinion Dated May 7, 2022 From the International Searching Authority Re. Application No. PCT/CN2022/111237 and Its Translation Into English. (15 Pages).
(Continued)

*Primary Examiner* — Abdul-Samad A Adediran

(57) ABSTRACT

A gate drive circuit and a display panel are provided. A pull-up module and a pull-down module of the gate drive circuit output a constant-voltage high potential to a second node, a third node, and a n-th stage gate drive signal through a P-type thin film transistor and output constant-voltage low potential through a N-type thin film transistor to the second node, the third node, and an n-th gate drive signal, thereby improving the stability of the output signal of the thin film transistor connected to the gate drive circuit and the key node.

7 Claims, 3 Drawing Sheets

(56) References Cited

U.S. PATENT DOCUMENTS

| | | | |
|---|---|---|---|
| 2016/0132170 A1 | 5/2016 | Zhang et al. | |
| 2017/0162152 A1 | 6/2017 | Zhao | |
| 2018/0151139 A1 | 5/2018 | Yi et al. | |
| 2022/0223109 A1* | 7/2022 | Lai | G11C 19/287 |

FOREIGN PATENT DOCUMENTS

| | | |
|---|---|---|
| CN | 105427821 | 3/2016 |
| CN | 106205518 | 12/2016 |
| CN | 110379349 | 10/2019 |
| CN | 110521124 | 11/2019 |
| CN | 111754916 | 10/2020 |
| CN | 112053655 | 12/2020 |
| CN | 112735318 | 4/2021 |
| EP | 1014334 | 6/2000 |
| JP | 11-163713 | 6/1999 |
| WO | WO 2021/007932 | 1/2021 |

OTHER PUBLICATIONS

Notification of Office Action and Search Report Dated Nov. 28, 2022 From the State Intellectual Property Office of the People's Republic of China Re. Application No. 202110884027.1 and Its Translation Into English.

\* cited by examiner

GATE DRIVE CIRCUIT AND DISPLAY PANEL

RELATED APPLICATIONS

This application is a National Phase of PCT Patent Application No. PCT/CN2021/111237 having International filing date of Aug. 6, 2021, which claims the benefit of priority of Chinese Patent Application No. 202110884027.1 filed on Aug. 3, 2021. The contents of the above applications are all incorporated by reference as if fully set forth herein in their entirety.

FIELD AND BACKGROUND OF THE INVENTION

The present disclosure relates to the technical field of display, which particularly relates to a gate drive circuit and a display panel.

Gate driver on array (GOA) technology is a gate drive technology that integrates the gate drive circuit of a display panel on the glass substrate. GOA technology can reduce the bonding process of external ICs, thereby reducing product costs, and is more suitable for manufacturing narrow bezel or bezel-less display products.

The GOA circuit is composed of multiple thin film transistors. Thin film transistors are classified into N-type thin film transistors and P-type thin film transistors according to their electrical characteristics. The conduction characteristic of the N-type thin film transistor is $V_{gs}>V_{th}$, and the conduction characteristic of the P-type thin film transistor is $V_{gs}<V_{th}$. $V_{gs}$ is the gate-source potential difference of the thin film transistor, and $V_{th}$ is the threshold voltage of the thin film transistor. It can be seen that the N-type thin film transistor has a stronger ability to output constant voltage low potential, while the P-type thin film transistor has a stronger ability to output a constant voltage high potential. On the other hand, if the gate of the N-type thin film transistor maintains a high potential for a long time, or the gate of a P-type thin film transistor maintains a low potential for a long time, the thin film transistor is prone to the phenomenon of threshold voltage drift due to long-term electrical stress. Based on the above two aspects, if the thin film transistor connected to key node of the GOA circuit uses a single N-type thin film transistor or a single P-type thin film transistor, certain disadvantages may be caused, thereby rendring the GOA circuit unstable.

Therefore, there is an urgent need to propose a new gate drive circuit that can improve the stability of the thin film transistors connected to the key nodes, thereby improving the stability of the gate drive circuit.

Technical Problems: The GOA circuit is composed of multiple thin film transistors. Thin film transistors are classified into N-type thin film transistors and P-type thin film transistors according to their electrical characteristics. The conduction characteristic of the N-type thin film transistor is $V_{gs}>V_{th}$ and the conduction characteristic of the P-type thin film transistor is $V_{gs}<V_{th}$. $V_{gs}$ is the gate-source potential difference of the thin film transistor, and $V_{th}$ is the threshold voltage of the thin film transistor. It can be seen that the N-type thin film transistor has a stronger ability to output a constant voltage low potential, while the P-type thin film transistor has a stronger ability to output a constant voltage high potential. On the other hand, if the gate of the N-type thin film transistor maintains a high potential for a long time, or the gate of a P-type thin film transistor maintains a low potential for a long time, the thin film transistor is prone to the phenomenon of threshold voltage drift due to long-term electrical stress.

SUMMARY OF THE INVENTION

Technical Solutions: To solve the problem that the conventional gate drive circuit is not stable enough because thin film transistors connected to key nodes use a single N-type thin film transistor or a single P-type thin film transistor. The embodiment of the present disclosure provides a gate driving circuit and a display panel.

In a first aspect, an embodiment of the present disclosure provides a gate drive circuit, wherein the gate drive circuit comprises cascaded gate drive units, wherein at least one of the gate drive units comprises:
  an output line; and
  an output module including a first thin film transistor, a second thin film transistor, and a third thin film transistor, wherein a gate of the first thin film transistor and a gate of the second thin film transistor are connected to a first line, a source of the first thin film transistor is connected to a second line, a source of the second thin film transistor is connected to a third line, a drain of the first thin film transistor, a drain of the second thin film transistor, and a gate of the third thin film transistor are connected to each other, a source of the third thin film transistor is connected to the second line or the third line, and a drain of the third thin film transistor is connected to an output;
  wherein a potential of the second line in a condition that the first thin film transistor is turned on is greater than a potential of the third line in a condition that the second thin film transistor is turned on, the first thin film transistor is a P-type thin film transistor, and the second thin film transistor is an N-type thin film transistor.

In some embodiments, the source of the third thin film transistor is connected to the second line and the third thin film transistor is the P-type thin film transistor.

In some embodiments, the source of the third thin film transistor is connected to the third line and the third thin film transistor is the N-type thin film transistor.

In a second aspect, an embodiment of the present disclosure provides a gate drive circuit, wherein the gate drive circuit comprises cascaded gate drive units, and the gate drive unit of each stage comprises:
  wherein the pull-up module includes a first thin film transistor, a second thin film transistor, and a third thin film transistor; a gate of the first thin film transistor and a gate of the second thin film transistor are connected to a first node; a source of the first thin film transistor and a source of the third thin film transistor are connected to an n-th clock signal; a source of the second thin film transistor is connected to a constant-voltage low potential; a drain of the first thin film transistor, a drain of the second thin film transistor, and a gate of the third thin film transistor are connected to a second node; a drain of the third thin film transistor is connected to an output of an n-th stage gate drive signal; the first thin film transistor and the third thin film transistor are P-type thin film transistors, and the second thin film transistor is an N-type thin film transistor;
  wherein the pull-down module includes a fourth thin film transistor, a fifth thin film transistor, and a sixth thin film transistor; a gate of the fourth thin film transistor and a gate of the fifth thin film transistor are connected to the n-th clock signal; a source of the fourth thin film transistor is connected to a constant-voltage high potential; a source of the fifth thin film transistor and a source of the sixth thin film transistor are connected to a constant-voltage low potential; a drain of the fourth thin film transistor, a drain of the fifth thin film transistor, and a gate of the sixth thin film transistor are connected to a third node; a drain of the sixth thin film transistor is connected to the output of the n-th stage gate drive signal; the fourth thin film transistor is a P-type thin film transistor, and the fifth thin film transistor and the sixth thin film transistor are N-type thin film transistors.

In some embodiments, the gate drive circuit further comprises a pull-up control module including a seventh thin film transistor, an eighth thin film transistor, a ninth thin film transistor, and a first capacitor; a gate of the seventh thin film transistor, a drain of the eighth thin film transistor, and a drain of the ninth thin film transistor are connected to a fourth node; a source of the seventh thin film transistor is connected to a (n−1)-th stage gate drive signal; a drain of the seventh thin film transistor is connected to the first node; a gate of the eighth thin film transistor is connected to a (n−2)-th clock signal; a source of the eighth thin film transistor is connected to a (n−2)-th stage gate drive signal; a gate of the ninth thin film transistor is connected to the n-th clock signal; a source of the ninth thin film transistor is connected to the constant-voltage low potential and connected to the fourth node; one end of the first capacitor is connected to the fourth node; the other end of the first capacitor is connected to the (n−1)-th stage gate drive signal.

In some embodiments, the pull-down module further includes a tenth thin film transistor, a gate of the tenth thin film transistor is connected to a (n+2)-th clock signal, a source of the tenth thin film transistor is connected to the constant-voltage low potential, and a drain of the tenth thin film transistor is connected to the first node.

In some embodiments, the gate drive circuit further comprises a reset module including an eleventh thin film transistor, a gate of the eleventh thin film transistor is connected to a reset signal, a source of the eleventh thin film transistor is connected to the constant-voltage low potential, and a drain of the eleventh thin film transistor is connected to the first node.

In some embodiments, the gate drive circuit further comprises a second capacitor, one end of the second capacitor is connected to the first node, and the other end of the second capacitor is connected to the constant-voltage low potential.

In some embodiments, the gate drive circuit further comprises a gate drive signal turn-off module including a twelfth thin film transistor, a gate of the twelfth thin film transistor is connected to a global control signal, a source of the twelfth thin film transistor is connected to the constant-voltage low potential, and a drain of the twelfth thin film transistor is connected to the output of the n-th stage gate drive signal.

In some embodiments, the first thin film transistor, the third thin film transistor, and the fourth thin film transistor are low temperature polysilicon thin film transistors, and the second thin film transistor, the fifth thin film transistor, and the sixth thin film transistor are oxide thin film transistors.

In a third aspect, an embodiment of the present disclosure further provides a display panel, wherein the display panel comprises a gate drive circuit including cascaded gate drive units, and at least one of the gate drive units comprises:
an output line; and
an output module including a first thin film transistor, a second thin film transistor, and a third thin film transistor, wherein a gate of the first thin film transistor and a gate of the second thin film transistor are connected to a first line, a source of the first thin film transistor is connected to a second line, a source of the second thin film transistor is connected to a third line, a drain of the first thin film transistor, a drain of the second thin film transistor, and a gate of the third thin film transistor are connected to each other, a source of the third thin film transistor is connected to the second line or the third line, and a drain of the third thin film transistor is connected to an output;
wherein a potential of the second line when the first thin film transistor is turned on is greater than a potential of the third line when the second thin film transistor is turned on, the first thin film transistor is a P-type thin film transistor, and the second thin film transistor is an N-type thin film transistor.

In some embodiments, the source of the third thin film transistor is connected to the second line and the third thin film transistor is a P-type thin film transistor.

In some embodiments, the source of the third thin film transistor is connected to the third line and the third thin film transistor is an N-type thin film transistor.

In a fourth aspect, an embodiment of the present disclosure further provides a display panel, wherein the display panel comprises a gate drive circuit, and the gate drive circuit comprises cascaded gate drive units, and the gate drive unit of each stage comprises a pull-up module and a pull-down module;
wherein the pull-up module includes a first thin film transistor, a second thin film transistor, and a third thin film transistor; a gate of the first thin film transistor and a gate of the second thin film transistor are connected to a first node; a source of the first thin film transistor and a source of the third thin film transistor are connected to an n-th clock signal; a source of the second thin film transistor is connected to a constant-voltage low potential; a drain of the first thin film transistor, a drain of the second thin film transistor, and a gate of the third thin film transistor are connected to a second node; a drain of the third thin film transistor is connected to an output of the an n-th stage gate drive signal; the first thin film transistor and the third thin film transistor are P-type thin film transistors, and the second thin film transistor is an N-type thin film transistor;
wherein the pull-down module includes a fourth thin film transistor, a fifth thin film transistor, and a sixth thin film transistor; a gate of the fourth thin film transistor and a gate of the fifth thin film transistor are connected to the n-th clock signal; a source of the fourth thin film transistor is connected to a constant-voltage high potential; a source of the fifth thin film transistor and a source of the sixth thin film transistor are connected to a constant-voltage low potential; a drain of the fourth thin film transistor, a drain of the fifth thin film transistor, and a gate of the sixth thin film transistor are connected to a third node; a drain of the sixth thin film transistor is connected to the output of the n-th stage gate drive signal; the fourth thin film transistor is a P-type thin film transistor, and the fifth thin film transistor and the sixth thin film transistor are N-type thin film transistors.

In some embodiments, the gate drive circuit further comprises a pull-up control module including a seventh thin film transistor, an eighth thin film transistor, a ninth thin film transistor, and a first capacitor; a gate of the seventh thin film transistor, a drain of the eighth thin film transistor, and a drain of the ninth thin film transistor are connected to a fourth node, a source of the seventh thin film transistor is connected to a (n−1)-th stage gate drive signal, a drain of the seventh thin film transistor is connected to the first node, a gate of the eighth thin film transistor is connected to a (n−2)-th clock signal, a source of the eighth thin film transistor is connected to a (n−2)-th stage gate drive signal, a gate of the ninth thin film transistor is connected to the n-th clock signal, a source of the ninth thin film transistor is connected to the constant-voltage low potential and connected to the fourth node, one end of the first capacitor is connected to the fourth node, and the other end of the first capacitor is connected to the (n−1)-th stage gate drive signal.

In some embodiments, the pull-down module further includes a tenth thin film transistor, a gate of the tenth thin film transistor is connected to a (n+2)-th clock signal, a source of the tenth thin film transistor is connected to the constant-voltage low potential, and a drain of the tenth thin film transistor is connected to the first node.

In some embodiments, the gate drive circuit further comprises a reset module including an eleventh thin film transistor, a gate of the eleventh thin film transistor is connected to a reset signal, a source of the eleventh thin film transistor is connected to the constant-voltage low potential, and a drain of the eleventh thin film transistor is connected to the first node.

In some embodiments, the gate drive circuit further comprises a second capacitor, one end of the second capacitor is connected to the first node, and the other end of the second capacitor is connected to the constant-voltage low potential.

In some embodiments, the gate drive circuit further comprises a gate drive signal turn-off module including a twelfth thin film transistor, a gate of the twelfth thin film transistor is connected to a global control signal, a source of the twelfth thin film transistor is connected to the constant-voltage low potential, and a drain of the twelfth thin film transistor is connected to the output of the n-th stage gate drive signal.

In some embodiments, the first thin film transistor, the third thin film transistor, and the fourth thin film transistor are low temperature polysilicon thin film transistors, and the second thin film transistor, the fifth thin film transistor, and the sixth thin film transistor are oxide thin film transistors.

Beneficial Effects: In the gate drive circuit and the display panel provided by the embodiments of the present disclosure, the pull-up module of each stage of the gate drive unit uses the first thin film transistor of the P-type thin film transistor to output a constant-voltage high potential to the second node. The third thin film transistor using the P-type thin film transistor outputs a constant-voltage high potential to the n-th gate drive signal. The second thin film transistor using the N-type thin film transistor outputs a constant voltage low potential to the second node. The pull-down module uses the fourth thin film transistor of the P-type thin film transistor to output a constant-voltage high potential to the third node. The fifth thin film transistor using the N-type thin film transistor outputs a constant-voltage low potential to the third node. The sixth thin film transistor using the N-type thin film transistor outputs a constant voltage low potential to the n-th stage gate drive signal.

According to the electrical characteristics that the P-type thin film transistor is turned on when the gate voltage is a negative voltage, and the N-type thin film transistor is turned on when the gate voltage is a positive voltage, the pull-up module and the pull-down module output high potentials to the second node, the third node and the n-th stage gate drive signal through the P-type thin film transistor. The N-type thin film transistor outputs low potential to the second node, the third node, and the n-th gate drive signal, thereby improving the stability of the thin film transistor connected to the gate drive circuit and the pull-up node (the first node) or the pull-down node (G(n)). The pull-up module and the pull-down module adopt a CMOS structure composed of P-type thin film transistors and N-type thin film transistors in series. The first thin film transistor and the second thin film transistor switch each other to output high and low signals, and the fourth thin film transistor and the fifth thin film transistor switch each other to output high and low signals, so that the second node and the third node are not at a high potential for a long time. Therefore, the third thin film transistor and the sixth thin film transistor do not have threshold voltage drift due to long-term electrical stress, thereby improving the stability of the gate drive circuit.

DESCRIPTION OF SPECIFIC EMBODIMENTS OF THE INVENTION

To make the purpose, technical solutions, and effects of the present disclosure clearer, the following further describes the present disclosure in detail with reference to the accompanying drawings and examples. It should be understood that the specific embodiments described here are only used to explain the present disclosure, and the content is not limited to the present disclosure.

Figure 1:
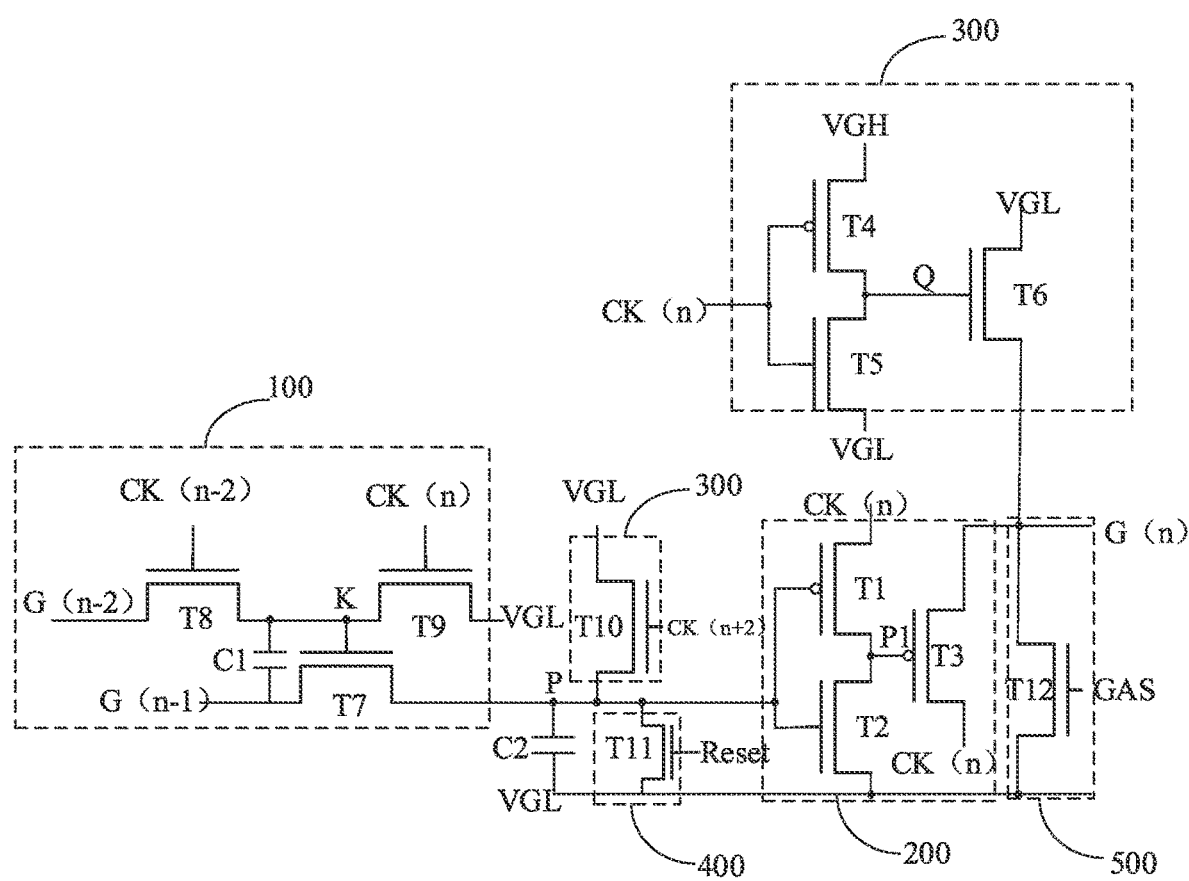
FIG. 1 is a schematic circuit diagram of a gate drive circuit according to an embodiment of the present disclosure.

Refer to FIG. 1. FIG. 1 is a schematic circuit diagram of a gate drive circuit according to an embodiment of the present disclosure. An embodiment of the present disclosure provides a gate drive circuit, wherein the gate drive circuit comprises cascaded gate drive units, and at least one of the gate drive units comprises:
an output line; and
an output module including a first thin film transistor, a second thin film transistor, and a third thin film transistor, wherein a gate of the first thin film transistor and a gate of the second thin film transistor are connected to a first line, a source of the first thin film transistor is connected to a second line, a source of the second thin film transistor is connected to a third line, a drain of the first thin film transistor, a drain of the second thin film transistor, and a gate of the third thin film transistor are connected to each other, a source of the third thin film transistor is connected to the second line or the third line, and a drain of the third thin film transistor is connected to an output;
wherein a potential of the second line in a condition that the first thin film transistor is turned on is greater than a potential of the third line in a condition that the second thin film transistor is turned on, the first thin film transistor is a P-type thin film transistor, and the second thin film transistor is an N-type thin film transistor.

In some embodiment, the source of the third thin film transistor is connected to the second line and the third thin film transistor is the P-type thin film transistor.

In some embodiment, the source of the third thin film transistor is connected to the third line and the third thin film transistor is the N-type thin film transistor.

In the gate drive circuit provided by the embodiment of the present disclosure, the output module is used to turn on the second thin film transistor and turn off the first thin film transistor when the first line is at a high potential. The potential of the third line is transmitted to the gate of the third thin film transistor through the second thin film transistor. In a condition that the third thin film transistor is a P-type thin film transistor, the potential of the third line is used to turn on the third thin film transistor. At this time, the source of the third thin film transistor is connected to the second line, and the potential of the second line is output to the output line through the third thin film transistor. In the same way, when the first line is at a low potential, the first thin film transistor is turned on and the second thin film transistor is turned off. The potential of the second line is transmitted to the gate of the third thin film transistor through the first thin film transistor. In a condition that the third thin film transistor is an N-type thin film transistor, the third thin film transistor is turned on by the potential of the second line. The source of the third thin film transistor is connected to the third line, and the potential of the third line is transmitted to the output line through the third thin film transistor. Thus, it is realized that the higher potential of the second line is transmitted to the gate of the third thin film transistor through the first thin film transistor (P-type thin film transistor), and the second thin film transistor (N-type thin film transistor) transmits the lower third line potential to the gate of the third thin film transistor. When the third thin film transistor is a P-type thin film transistor, the higher potential of the second line is transmitted to the output line. When the third thin film transistor is an N-type thin film transistor, the lower potential of the third line is transmitted to the output line, that is, in the output module.

It should be noted that the output module may be applied to any part of the gate drive unit. Generally, the pull-up node and the pull-down node of the gate drive circuit are the two most important nodes. Therefore, the output module may be applied to the pull-up module and/or the pull-down module. In the following specific gate drive circuit, when the output module is applied to the pull-up module 200, the first line is connected to the first node P, and the second line is connected to the nth clock signal CK(n). The third line is connected to the constant-voltage low potential VGL, and the output line is connected to the n-th stage gate drive signal G(n). When the output module is applied to the pull-down module 300, The first line is connected to the nth clock signal CK(n), and the second line is connected to the constant-voltage high potential VGH. The third line is also connected to the constant-voltage low potential VGL, and the output line is also connected to the n-th stage gate drive signal G(n). The first thin film transistor of the output module may be the first thin film transistor of the pull-up module 200 or the fourth thin film transistor of the pull-down module 300. The second thin film transistor of the output module may be the second thin film transistor of the pull-up module 200 or the fifth thin film transistor of the pull-down module 300. The third thin film transistor of the output module may be the third thin film transistor of the pull-up module 200 or the sixth thin film transistor of the pull-down module 300.

Refer to FIG. 1, the embodiment of the present disclosure further discloses a specific gate drive circuit. The gate drive circuit comprises cascaded gate drive units, wherein the gate drive unit of each stage comprises a pull-up module 200 and a pull-down module 300.

The pull-up module 200 includes a first thin film transistor T1, a second thin film transistor T2, and a third thin film transistor T3. A gate of the first thin film transistor T1 and a gate of the second thin film transistor T2 are connected to a first node P. A source of the first thin film transistor T1 and a source of the third thin film transistor T3 are connected to an n-th clock signal CK(n). A source of the second thin film transistor is connected to a constant-voltage low potential VGL. A drain of the first thin film transistor T1, a drain of the second thin film transistor T2, and a gate of the third thin film transistor T3 are connected to a second node P1. A drain of the third thin film transistor T3 is connected to an output of an n-th stage gate drive signal G(n). The first thin film transistor T1 and the third thin film transistor T3 are P-type thin film transistors, and the second thin film transistor T2 is an N-type thin film transistor.

The pull-down module 300 includes a fourth thin film transistor T4, a fifth thin film transistor T5, and a sixth thin film transistor T6. A gate of the fourth thin film transistor T4 and a gate of the fifth thin film transistor T5 are connected to the n-th clock signal CK(n). a source of the fourth thin film transistor T4 is connected to a constant-voltage high potential VGH. A source of the fifth thin film transistor T5 and a source of the sixth thin film transistor T6 are connected to a constant-voltage low potential VGL. A drain of the fourth thin film transistor T4, a drain of the fifth thin film transistor T5, and a gate of the sixth thin film transistor T6 are connected to a third node Q. A drain of the sixth thin film transistor T6 is connected to the output of the n-th stage gate drive signal G(n). The fourth thin film transistor T4 is a P-type thin film transistor, and the fifth thin film transistor T5 and the sixth thin film transistor T6 are N-type thin film transistors.

In the gate drive circuit provided by the embodiment of the present disclosure, the pull-up module of each stage of the gate drive unit uses the first thin film transistor of the P-type thin film transistor to output a high potential to the second node. The third thin film transistor using the P-type thin film transistor outputs a high potential to the n-th stage gate drive signal, and the second thin film transistor using the N-type thin film transistor outputs a low potential to the second node. The pull-down module uses the fourth thin film transistor of the P-type thin film transistor to output a high potential to the third node. The fifth thin film transistor using the N-type thin film transistor outputs a low potential to the third node. The sixth thin film transistor using the N-type thin film transistor outputs a low potential to the n-th stage gate drive signal. The pull-up module is connected to the pull-up node (the first node P), and the pull-down module is connected to the pull-down node (G(n)).

According to the electrical characteristics that the P-type thin film transistor is turned on when the gate voltage is a negative voltage, and the N-type thin film transistor is turned on when the gate voltage is a positive voltage, the pull-up module and the pull-down module output high potentials to the second node, the third node and the n-th stage gate drive signal through the P-type thin film transistor. The N-type thin film transistor outputs low potential to the second node, the third node, and the n-th gate drive signal, thereby improving the stability of the thin film transistor connected to the gate drive circuit and the pull-up node (the first node) or the pull-down node (G(n)). The pull-up module and the pull-down module adopt a CMOS structure composed of P-type thin film transistors and N-type thin film transistors in series. The first thin film transistor and the second thin film transistor switch each other to output high and low signals, and the fourth thin film transistor and the fifth thin film transistor switch each other to output high and low signals, so that the second node and the third node is not at a high potential for a long time. Therefore, the third thin film transistor and the sixth thin film transistor do not have threshold voltage drift due to long-term electrical stress, thereby improving the stability of the gate drive circuit.

The first thin film transistor T1, the second thin film transistor T2, the third thin film transistor T3, the fourth thin film transistor T4, the fifth thin film transistor T5, and the sixth thin film transistor T6 may use low temperature polysilicon (LTPS) thin film transistors or oxide (IGZO) thin film transistors, respectively. To balance the gap between the mobility of P-type thin film transistors and that of N-type thin film transistors, it may be combined with low-temperature polysilicon (LTPS) thin-film transistors and oxide (IGZO) thin-film transistors according to the characteristics that the mobility of low-temperature polysilicon thin-film transistors is higher than that of N-type thin-film transistors, based on low-temperature oxide (LTPO) technology. The first thin film transistor T1, the third thin film transistor T3, and the fourth thin film transistor T4 using P-type thin film transistors are low-temperature polysilicon thin film transistors. The second thin film transistor T2, the fifth thin film transistor T5, and the sixth thin film transistor T6 using N-type thin film transistors are oxide thin film transistors. As a result, the first thin film transistor T1, the second thin film transistor T2, the third thin film transistor T3, the fourth thin film transistor T4, the fifth thin film transistor T5, and the sixth thin film transistor T6 tend to be consistent. Combining the advantages of high mobility of low-temperature polysilicon (LTPS) thin-film transistors and low leakage current of oxide (IGZO) thin-film transistors, the gate drive circuit may meet both high-frequency and low-frequency applications. In the same way, other thin film transistors in the gate drive circuit can also be selected accordingly, the P-type thin film transistor is a low-temperature polysilicon thin film transistor, and the N-type thin film transistor is an oxide thin film transistor.

In some embodiments, each stage of the gate drive unit further includes a pull-up control module 100. The pull-up control module 100 includes a seventh thin film transistor T7, an eighth thin film transistor T8, a ninth thin film transistor T9 and a first capacitor C1. The gate of the seventh thin film transistor T7, the drain of the eighth thin film transistor T8, and the drain of the ninth thin film transistor T9 are connected to the fourth node K. The source of the seventh thin film transistor T7 is connected to the (n−1)-th stage gate drive signal G(n−1). A drain of the seventh thin film transistor T7 is connected to the first node P. A gate of the eighth thin film transistor T8 is connected to a (n−2)-th clock signal CK(n−2). A source of the eighth thin film transistor T8 is connected to a (n−2)-th stage gate drive signal G(n−2). A gate of the ninth thin film transistor is connected to the n-th clock signal CK(n). A source of the ninth thin film transistor T9 is connected to the constant-voltage low potential VGL. One end of the first capacitor C1 is connected to the fourth node K. The other end of the first capacitor C1 is connected to the (n−1)-th stage gate drive signal G(n−1).

Specifically, in the pull-up control module 100, the eighth thin film transistor T8 is under the control of the n−2th clock signal CK(n−2), the (n−2)th stage gate drive signal G(n−2) raises the potential of the fourth node K to a constant-voltage high Potential VGH. At the same time, the first capacitor C1 is charged. The first capacitor C1 increases the fourth node K from the constant-voltage high potential VGH to a higher potential under the coupling of the (n−1)th stage gate drive signal G(n−1). Thus, the eighth thin film transistor T8 is turned on more thoroughly, that is, the potential of the gate of the seventh thin film transistor T7 is increased through the eighth thin film transistor T8. When the seventh thin film transistor T7 is an N-type thin film transistor, the ability of the seventh thin film transistor T7 to output a constant-voltage high potential VGH can be improved.

Further, the pull-up control module 100 further includes a ninth thin film transistor T9. The gate of the ninth thin film transistor T9 is connected to the nth clock signal CK(n). The source of the ninth thin film transistor T9 is connected to the constant-voltage low potential VGL. The drain of the ninth thin film transistor T9 is connected to the fourth node K. The ninth thin film transistor T9 is under the control of the nth clock signal CK(n), the gate potential of the seventh thin film transistor T7 is pulled down by the constant-voltage low potential VGL, so that the seventh thin film transistor T7 is turned off, thereby improving the stability of the first node P. It is understandable that based on the characteristics that the P-type thin film transistor is more suitable for outputting a constant-voltage high potential VGH, and the N-type thin film transistor is more suitable for outputting a constant-voltage low potential VGL, the ninth thin film transistor T9 may be an N-type thin film transistor.

In some embodiments, the pull-down module 300 further includes a tenth thin film transistor T10. A gate of the tenth thin film transistor T10 is connected to the (n+2)th clock signal CK(n+2), a source of the tenth thin film transistor T10 is connected to Into the constant-voltage low potential VGL, and the drain of the tenth thin film transistor T10 is connected to the first node P.

In some embodiments, the gate drive unit of each stage further includes a reset module 400. The reset module 400 includes an eleventh thin film transistor T11. A gate of the eleventh thin film transistor T11 is connected to the reset signal Reset, a source of the eleventh thin film transistor T11 is connected to the constant-voltage low potential VGL, and a drain of the eleventh thin film transistor T11 is connected to the first node P.

It is understandable that P-type thin film transistors are more suitable for outputting constant-voltage and high potential VGH. The N-type thin film transistor is more suitable for the principle of outputting a constant-voltage and low potential VGL. The tenth thin film transistor T10 and the eleventh thin film transistor T11 can both adopt N-type thin film transistors.

In some embodiments, each stage of the gate drive unit further includes a second capacitor C2. One end of the second capacitor C2 is connected to the first node P, the other end of the second capacitor C2 is connected to the constant-voltage low potential VGL, and the second capacitor C2 is used to maintain the stability of the first potential.

Figure 2:
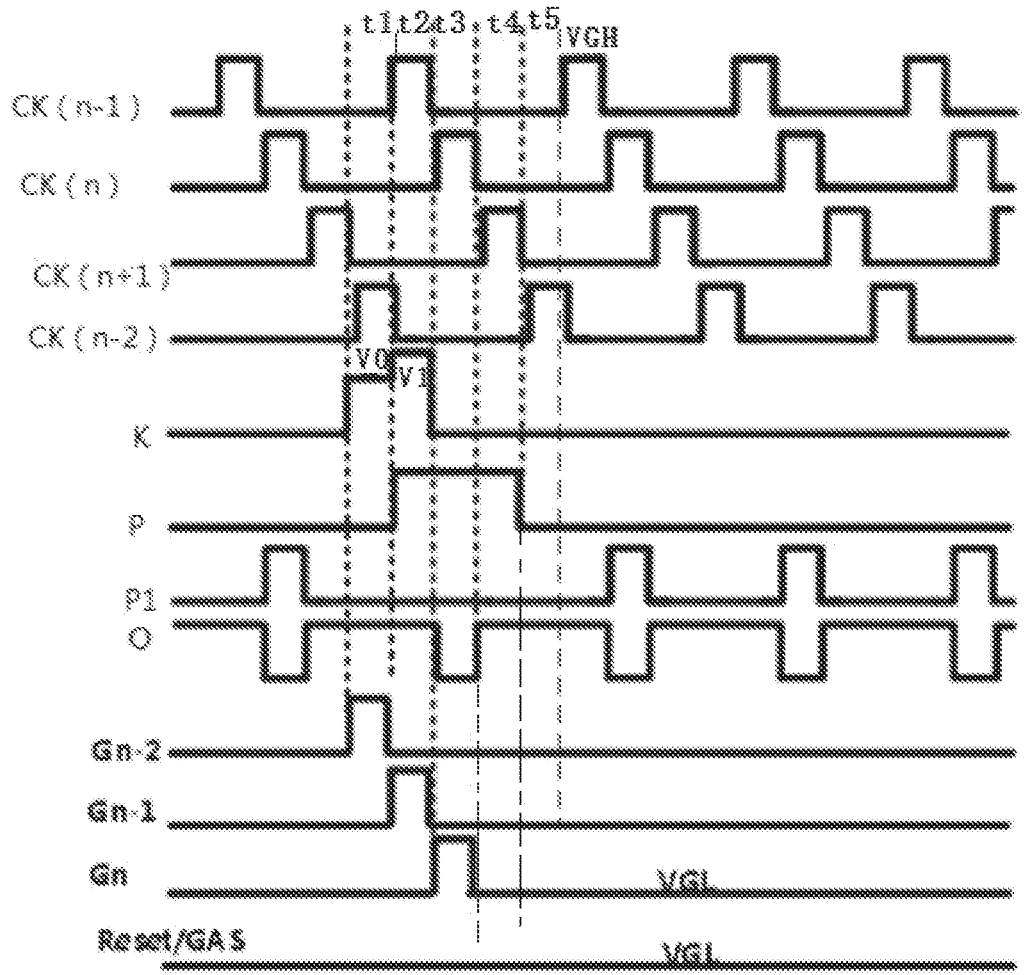
FIG. 2 is a schematic diagram of a timing sequence of a gate drive circuit according to an embodiment of the present disclosure.

Based on the foregoing embodiment, FIG. 2 is a schematic diagram of a timing sequence of a gate drive circuit according to an embodiment of the present disclosure. With reference to FIG. 1 and FIG. 2, the working process of the gate drive unit of the nth stage of the gate drive circuit will be described in detail below.

Specifically, a normal display phase of the gate drive circuit includes a reset sub-phase t0, a first pre-charge sub-phase t1, a second pre-charge sub-phase t2, an output sub-phase t3, a pull-down sub-phase t4, and a pull-down sustain sub-phase t5.

In the reset sub-phase t0 (not shown), the reset signal Reset is at a high level, so that the eleventh thin film transistor T11 is turned on, thereby resetting the first node P to a low level.

In the first pre-charge sub-phase t1, the (n−2)th clock signal CK(n−2) and the (n−2)th stage gate drive signal G(n) are at a high potential, so that the eighth thin film transistor T8 is turned on. The fourth node K is pulled up to a high potential V0 (V0=VGH), so that the first capacitor C1 is charged, and the seventh thin film transistor T7 is turned on.

In the second pre-charge sub-phase t2, the (n−1)th clock signal CK(n−1) and the n−1th stage gate drive signal G(n−1) are at high potential. Through the coupling effect of the first capacitor C1, the potential of the fourth node K is further increased from V0 to the potential V1 (V1>V0), so that the seventh thin film transistor T7 is turned on more thoroughly, the potential of the first node P rises, and the second capacitor C2 is charged.

In the output sub-phase t3, the nth clock signal CK(n) and the nth gate drive signal G(n) are at high potentials. The ninth thin film transistor T9 is turned on to pull down the potential of the fourth node K, so that the seventh thin film transistor T7 is turned off. The first node P is still at a high potential, so that the first thin film transistor T1 is turned off and the second thin film transistor T2 is turned on. The second thin film transistor T2 pulls the second node P1 low to turn on the third thin film transistor T3, thereby outputting the nth stage gate drive signal G(n) through the nth clock signal CK(n). At this time, the fourth thin film transistor T4 is turned off and the fifth thin film transistor T5 is turned on, the point Q is at a low potential, and the sixth thin film transistor T6 is turned off.

In the pull-down sub-phase t4, the (n+1)th clock signal CK(n+1) is at a high level, and the nth clock signal CK(n) is at a low level. The fourth thin film transistor T4 is turned on and the fifth thin film transistor T5 is turned off. The third node Q is pulled high, the sixth thin film transistor T6 is turned on, and the gate drive signal G(n) of the nth stage is pulled low.

In the pull-down sustain sub-phase t5, the (n+2)th clock signal CK (n+2) is at a high potential to turn on the tenth thin film transistor T10, and the first node P is pulled low. At this time, the second capacitor C2 maintains the first node P at a low potential, the Q point is maintained at a high potential, the sixth thin film transistor T6 is turned on, and the n-th stage gate drive signal G(n) is maintained at a low potential.

In the above-mentioned normal display phase, the pull-up module 200 outputs a high potential to the second node P1 through the P-type thin film transistor T1. The P-type thin film transistor T3 outputs a high potential to the n-th stage gate drive signal G(n). The pull-down module 300 outputs a high potential to the third node Q through the P-type thin film transistor T4. The pull-up module 200 outputs a low potential to the second node P1 through the N-type thin film transistor T2. The pull-up module outputs a low potential to the third node Q through the N-type thin film transistor T5, The N-type thin film transistor T6 outputs a constant-voltage low potential to the nth gate drive signal G(n), thereby improving the stability of the thin film transistor connected to the first node P and the n-th stage gate drive signal G(n) in the gate drive circuit. Since the pull-up module 200 and the pull-down module 300 adopt a CMOS structure composed of P-type thin film transistors and N-type thin film transistors in series, T1 and T2 switch each other to output high and low signals, and T4 and T5 switch each other to output high and low signals, so that the second node P1 and the third node Q is not at a high potential for a long time. Therefore, T3 and T6 is not subject to electrical stress for a long time to cause threshold voltage drift, thereby improving the stability of the gate drive circuit.

Further, referring to FIG. 1, the gate drive circuit further includes a gate drive signal turn-off module 500. The function of the gate drive signal turn-off module 500 is to insert a touch scan stage during the above-mentioned normal display stage to detect and collect touch signals. It is necessary to turn off the gate drive signals output by all gate drive units of the gate drive circuit. After the touch signal detection and collection are completed, the gate drive signal of the stop gate drive unit during the touch is output, to avoid interference between the gate drive signal and the touch signal.

Specifically, the gate drive signal turn-off module 500 includes a twelfth thin film transistor T12. A gate of the twelfth thin film transistor T12 is connected to the global control signal GAS, a source of the twelfth thin film transistor T12 is connected to the constant voltage low potential VGL, and a drain of the twelfth thin film transistor T12 is connected to the output terminal of the n-th stage gate drive signal G(n).

Understandably, P-type thin film transistors are more suitable for outputting constant voltage and high potential VGH, and N-type tubes are more suitable for outputting constant voltage and low potential VGL. The twelfth thin film transistor T12 may be an N-type thin film transistor.

Figure 3:
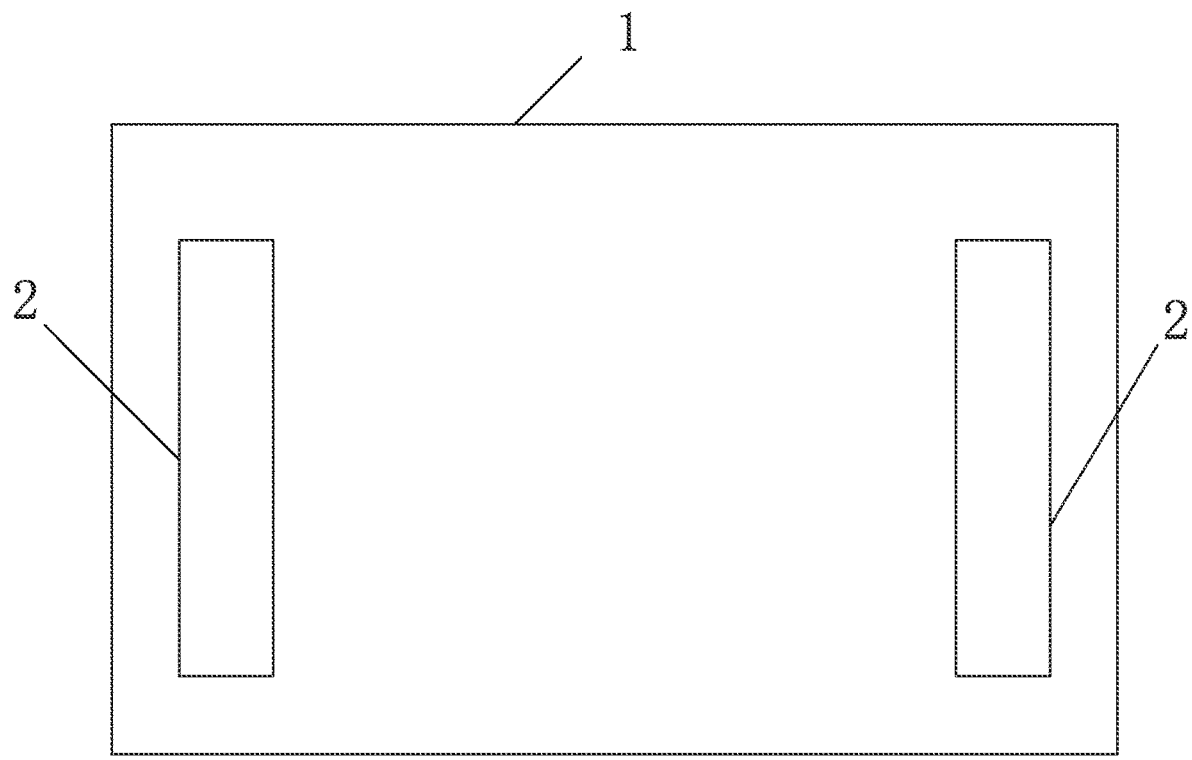
FIG. 3 is a schematic structural diagram of a display panel according to the embodiment of the present disclosure.

Refer to FIG. 3. FIG. 3 is a schematic structural diagram of a display panel according to the embodiment of the present disclosure. The embodiment of the present disclosure also provides a display panel, and the display panel 1 includes the gate drive circuit 2 as described above. The display panel 1 has the same structure and beneficial effects as the gate drive circuit 2 provided in the foregoing embodiment. Since the foregoing embodiment has described the structure and beneficial effects of the gate drive circuit 2 in detail, it is not repeated here.

It should be noted that for a small-sized display panel, the gate drive circuit 2 can be provided on only one side of the display panel 1 for unilateral driving. For display panels of medium and large sizes, gate drive circuits 2 can be provided on opposite sides of the display panel 1 for bilateral driving. It is understandable that for those of ordinary skill in the art, equivalent substitutions or changes can be made according to the technical solution of the present application and its inventive concept. All these changes or replacements shall fall within the protection scope of the appended claims of this application.

What is claimed is:

1. A gate drive circuit, comprising cascaded gate drive units, wherein the gate drive unit of each stage comprises a pull-up module and a pull-down module;

wherein the pull-up module includes a first thin film transistor, a second thin film transistor, and a third thin film transistor; a gate of the first thin film transistor and a gate of the second thin film transistor are connected to a first node; a source of the first thin film transistor and a source of the third thin film transistor are connected to an n-th clock signal; a source of the second thin film transistor is connected to a constant-voltage low potential; a drain of the first thin film transistor, a drain of the second thin film transistor, and a gate of the third thin film transistor are connected to a second node, a drain of the third thin film transistor is connected to an output of an n-th stage gate drive signal;

wherein the first thin film transistor and the third thin film transistor are P-type thin film transistors, and the second thin film transistor is an N-type thin film transistor;

wherein the pull-down module includes a fourth thin film transistor, a fifth thin film transistor, and a sixth thin film transistor; a gate of the fourth thin film transistor and a gate of the fifth thin film transistor are connected to the n-th clock signal; a source of the fourth thin film transistor is connected to a constant-voltage high potential; a source of the fifth thin film transistor and a source of the sixth thin film transistor are connected to a constant-voltage low potential; a drain of the fourth thin film transistor, a drain of the fifth thin film transistor, and a gate of the sixth thin film transistor are connected to a third node; a drain of the sixth thin film transistor is connected to the output of the n-th stage gate drive signal;

wherein the fourth thin film transistor is a P-type thin film transistor, and the fifth thin film transistor and the sixth thin film transistor are N-type thin film transistors.

2. The gate drive circuit according to claim 1, wherein the gate drive circuit further comprises a pull-up control module including a seventh thin film transistor, an eighth thin film transistor, a ninth thin film transistor, and a first capacitor;

wherein a gate of the seventh thin film transistor, a drain of the eighth thin film transistor, and a drain of the ninth thin film transistor are connected to a fourth node; a source of the seventh thin film transistor is connected to a (n−1)-th stage gate drive signal; a drain of the seventh thin film transistor is connected to the first node; a gate of the eighth thin film transistor is connected to a (n−2)-th clock signal; a source of the eighth thin film transistor is connected to a (n−2)-th stage gate drive signal; a gate of the ninth thin film transistor is connected to the n-th clock signal; a source of the ninth thin film transistor is connected to the constant-voltage low potential and connected to the fourth node; one end of the first capacitor is connected to the fourth node; the other end of the first capacitor is connected to the (n−1)-th stage gate drive signal.

3. The gate drive circuit according to claim 1, wherein the pull-down module further includes a tenth thin film transistor, a gate of the tenth thin film transistor is connected to a (n+2)-th clock signal, a source of the tenth thin film transistor is connected to the constant-voltage low potential, and a drain of the tenth thin film transistor is connected to the first node.

4. The gate drive circuit according to claim 1, wherein the gate drive circuit further comprises a reset module including an eleventh thin film transistor, a gate of the eleventh thin film transistor is connected to a reset signal, a source of the eleventh thin film transistor is connected to the constant-voltage low potential, and a drain of the eleventh thin film transistor is connected to the first node.

5. The gate drive circuit according to claim 1, wherein the gate drive circuit further comprises a second capacitor, one end of the second capacitor is connected to the first node, and the other end of the second capacitor is connected to the constant-voltage low potential.

6. The gate drive circuit according to claim 1, wherein the gate drive circuit further comprises a gate drive signal turn-off module including a twelfth thin film transistor, a gate of the twelfth thin film transistor is connected to a global control signal, a source of the twelfth thin film transistor is connected to the constant-voltage low potential, and a drain of the twelfth thin film transistor is connected to the output of the n-th stage gate drive signal.

7. The gate drive circuit according to claim 1, wherein the first thin film transistor, the third thin film transistor, and the fourth thin film transistor are low temperature polysilicon thin film transistors, and the second thin film transistor, the fifth thin film transistor, and the sixth thin film transistor are oxide thin film transistors.

\* \* \* \* \*